United States Patent [19]

Te Velde et al.

[11] 4,308,090
[45] Dec. 29, 1981

[54] METHOD OF MANUFACTURING A SEMICONDUCTOR DEVICE

[75] Inventors: Ties S. Te Velde; Donald R. Wolters, both of Eindhoven, Netherlands

[73] Assignee: U.S. Philips Corporation, New York, N.Y.

[21] Appl. No.: 16,843

[22] Filed: Mar. 2, 1979

Related U.S. Application Data

[63] Continuation of Ser. No. 813,822, Jul. 8, 1977, abandoned.

[30] Foreign Application Priority Data

Aug. 11, 1976 [NL] Netherlands ............... 7608901

[51] Int. Cl.³ .................................. C23F 1/02
[52] U.S. Cl. .............................. 156/652; 29/591; 156/656; 357/71; 427/90
[58] Field of Search ............... 357/47, 67–69, 357/71; 156/652, 650, 651, 656, 901, 902, 644; 124/68.5; 427/88, 89, 90; 29/580, 589, 590, 591

[56] References Cited

U.S. PATENT DOCUMENTS

| 3,647,585 | 3/1972 | Fritzinger et al. | 357/71 X |
| 3,715,785 | 2/1973 | Brown et al. | 357/68 X |
| 3,801,388 | 4/1974 | Akiyama et al. | 156/656 X |

Primary Examiner—William A. Powell
Attorney, Agent, or Firm—Thomas A. Briody; Robert T. Mayer; Steven R. Biren

[57] ABSTRACT

A method of manufacturing a semiconductor device having a multi-layer wiring system includes the steps of providing a first pattern of conductive regions on a major surface, providing an intermediate conductive layer over the major surface and the first pattern conductive regions, providing a second pattern of conductive tracks on the intermediate layer, and selectively etching the intermediate layer using the second pattern of tracks as an etching mask to completely remove the intermediate layer by underetching below portions of the second pattern tracks crossing over portions of the first pattern of conductive region where no electrical interconnection between the first and second conductive patterns is desired, while only partially removing the intermediate layer by underetching below portions of the second pattern of tracks crossing over portion of the first pattern of semiconductor regions where an electrical interconnection between the first and second conductor patterns is desired. In this manner, at least two separate parts of the first pattern of conductive regions are conductively connected at selected locations by a part of the second pattern of tracks in a method in which the conductive tracks of the uppermost level are used at a self-aligning etching mask.

7 Claims, 8 Drawing Figures

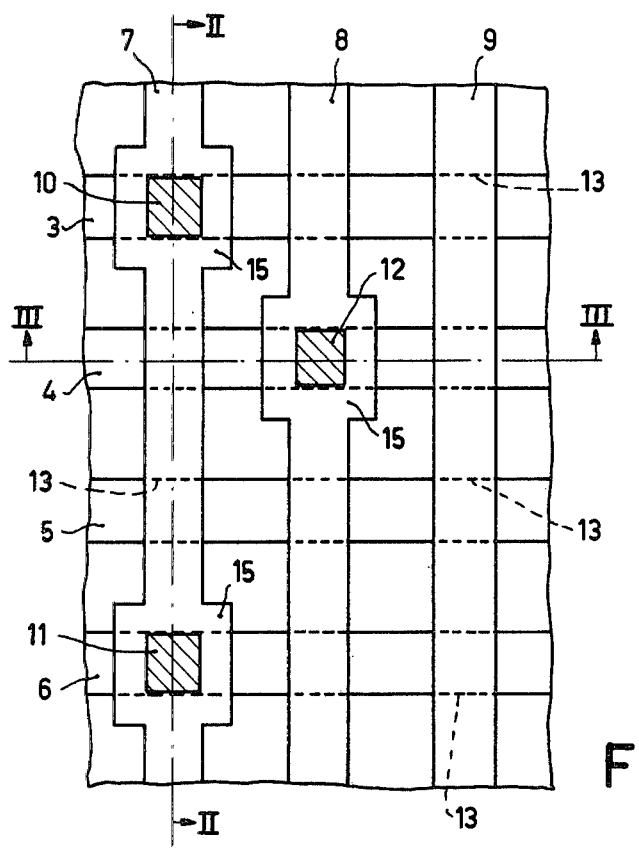
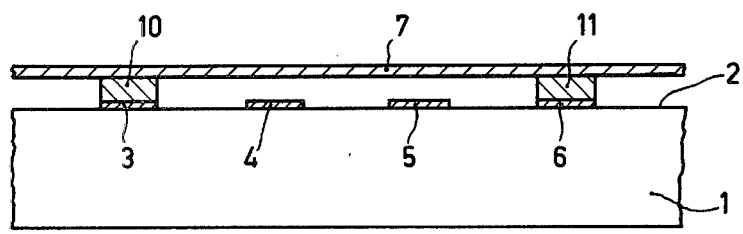
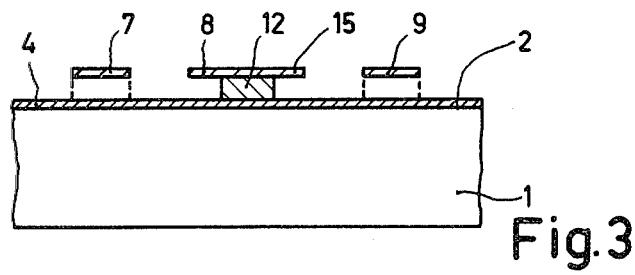

METHOD OF MANUFACTURING A SEMICONDUCTOR DEVICE

This is a continuation, of application Ser. No. 813,822, filed July 8, 1977, now abandoned.

The invention relates to a method of manufacturing a semiconductor device comprising a semiconductor body having at one of its surfaces a pattern, termed first pattern; of regions which are connected electrically to a pattern, termed second pattern, of conductor tracks. The invention relates in particular to a method of manufacturing a semiconductor device having a semiconductor body which is provided at one of its surfaces with a pattern of conductors comprising a first pattern of conductor tracks belonging to a lowermost conductor level and a second pattern of conductor tracks belonging to an uppermost conductor level which is connected electrically locally to the lowermost conductor level, the levels being insulated electrically from each other at the area of the crossing. The invention relates in addition to a semiconductor device manufactured by using such a method.

Integrated circuits having multi-layer wirings are generally known. Due to the possibility of crossings, the conductor pattern in multi-layer wiring systems can be constructed to be much more complex than in a monolayer wiring system in which such crossings are not possible. The degree of freedom in designing integrated circuits is thus much larger when using a multi-layer wiring, which is of importance in particular when the number of circuit elements (transistors, diodes, resistors, and so on) of the integrated circuit is very large. Such complicated circuits are often referred to in the literature as L.S.I. (Large Scale Integration) circuits.

In the most conventional construction of multi-layer wiring systems an insulating layer of, for example, silicon oxide is provided over the whole surface of the body after providing the conductor pattern of the lowermost conductor level. At the areas where during the subsequent process steps the connections are to be effected between the various levels, holes are etched in said dielectric layer by means of known photoetching methods. The dielectric layer insulates the conductor patterns of the various levels electrically from each other at the area of the crossings. The thickness of the layer is comparatively large so as to minimize the stray capacitances between the various conductor levels. A specific value for the thickness is 1 $\mu$m.

This method has important drawbacks in practice. The dielectric which is usually formed by a layer of silicon oxide deposited from the gaseous phase often proves to have small apertures, sometimes referred to as "pin holes" in the literature. Via said "pin holes" shortcircuits may occur between the lowermost conductor level and the uppermost conductor level which uppermost level is usually formed by depositing from the vapor phase or the gaseous phase particles of a suitable metal, for example aluminum.

Another important drawback resides in the fact that restrictions can be imposed upon the packing density. Since the connections between the various levels are to be effected via contact holes in the comparatively thick oxide layer, the distances between juxtaposed conductor tracks of the uppermost level often have to be made larger than is desired in connection with the packing density of the integrated circuit.

A further drawback is that a separate photolithographic process is required for providing contact holes in the silicon oxide layer for the connections between the various conductor levels.

Another method of manufacturing multi-layer wiring systems is described by Lepselter in "Bell systems Technical Journal" of February 1968, pp. 269/271. In this method, an intermediate layer of, for example, copper is provided on the body and on the lowermost conductor pattern after the conductor pattern of the lowermost level has been vapor-deposited on the body. At the sites where the conductor pattern of the uppermost level is to be connected to the pattern of the lowermost level, apertures are etched in the copper layer via a first mask, after which via a second mask the uppermost conductors are provided electrolytically in the form of a layer of gold. The copper layer is then etched away so that gold bridges are formed which are separated from the lowermost conductor level at the area of the crossings by an empty space (air). The piers of the gold bridges are formed by parts of the gold layer at the area of the connections. In this manner crossing conductors can be obtained without shortcircuits between the various conductor levels.

Since the dielectric constant of air (vacuum) is considerably smaller than that of silicon oxide, the stray capacitances of a conductor pattern comprising such bridges are generally comparatively small. In this connection the use of such bridges may provide important advantages also in the case of a mono-layer wiring system in which the conductor pattern should form low stray capacitances with regions of, for example, circuit elements formed in the semiconductor body.

However, the method is comparatively complicated and often requires even more process steps than the described conventional method in that the intermediate layer should successively be subjected to two etching treatments, namely an etching treatment to form holes at the area of the connections, to provide the uppermost conductor pattern and to remove the intermediate layer after providing the uppermost conductor pattern. Moreover, it is substantially not possible in this method to provide the conductor tracks as closely together as is often desired with a view to the packing density in integrated semiconductor circuits.

One of the objects of the invention is to provide a method of the kind which is comparatively simple and by means of which very large packing densities can be obtained.

The invention is based inter alia on the recognition of the fact that the connections between the conductor tracks of the lowermost and uppermost levels can be formed from the intermediate layer and that said connections can be obtained by subjecting the intermediate layer to a masked etching treatment in which the conductor track of the uppermost level is used as an etching mask.

Therefore, a method is characterized according to the invention in that, after providing the first pattern, a layer, termed the intermediate layer, is provided over the whole surface, which layer consists of a material which is electrically conductive, can be etched selectively with respect to the material of the conductor tracks of the second pattern, and can form a good adhesion with the regions and the material of the conductor tracks of the second pattern, after which the conductor tracks of the second pattern are provided on the intermediate layer and the intermediate layer is subjected to a selective etching treatment in which the tracks of the second pattern form an etching mask and the intermediate layer is locally removed entirely by underetching the intermediate layer below the tracks of the second pattern and in which the intermediate layer at the area of the connections is removed only partly by underetching below the tracks of the second pattern, so that two separated parts of the first pattern are conductively connected together by at least a part of the second pattern.

The invention provides the possibility of forming bridges of the type described in the conductor pattern in a very simple manner. Important advantages can be obtained in the case of devices having only a monolayer wiring pattern in which the stray capacitances between the conductor tracks and the elements in the semiconductor body should be kept low and in which the said regions of the first pattern can be formed, for example, by semiconductor zones of circuit elements. However, the invention is of particular importance in the case of multi-layer wirings having crossings between the various conductor levels. According to the invention such a method is characterized in that, after providing the conductor pattern of the lowermost level, an intermediate layer is provided over the whole surface of the body, which layer covers the conductor tracks of the lowermost conductor level and the space between said conductor tracks and which is of a material which is electrically conductive, can be etched selectively with respect to the materials which are used for the conductor patterns of the lowermost and uppermost levels and can form a good adhesion with said materials, after which the conductor pattern of the uppermost level is provided on the intermediate layer and the intermediate layer is subjected to a selective etching treatment in which the conductor pattern of the uppermost level forms an etching mask and the intermediate layer is removed entirely at least at the area of the crossing by underetching the intermediate layer below the track of the uppermost conductor pattern forming the crossing and in which the intermediate layer at the area of the electrical connections between the uppermost and lowermost conductor patterns is removed only partly by underetching the intermediate layer below the tracks of the uppermost level, so that two separated parts of the first pattern are conductively connected together by at least a part of the second pattern. Therefore the intermediate layer is subjected only to a single etching treatment namely after providing the conductor tracks of the uppermost level. A separate photoetching treatment before providing the uppermost conductor level for forming contact holes in the intermediate layer at the area of the connections between the various levels is not necessary.

The connections between the conductor levels are obtained in a self-registering manner with respect to the conductor tracks of the lowermost level. As a result of this the mutual distances between said conductor tracks may be chosen to be very small. This presents important advantages in connection with the packing density of the circuit.

A material which has proved particularly suitable for use for the intermediate layer is Ni .Al or double layers of Au with Pt and/or Ti may be used for the conductor patterns. As will be described with reference to the description of the figures, Ni can be etched selectively with respect to these materials. Ni also forms a good adhesion with the said materials. In addition, Ni can generally be etched away more rapidly from the intermediate layer when it forms a shortcircuited couple with a noble metal.

For carrying out the method according to the invention, various geometries may advantageously be used for the uppermost conductor level. For example, the conductor tracks of the uppermost level may be provided at the area of the crossings with narrowings as a result of which the intermediate layer may be removed entirely at the area of the crossings while elsewhere parts of the intermediate layer are still present. A preferred embodiment which permits of using higher packing densities is characterized in that the conductor tracks of the uppermost conductor level, at the area of the connections to conductor tracks of the lowermost conductor level, are provided with widenings below which the material of the intermediate layer is removed only partly during etching the intermediate layer.

The invention will now be described in greater detail with reference to various embodiments and the accompanying diagrammatic drawing, in which:

FIG. 1 is a plan view of a part of a semiconductor device having a conductor pattern manufactured by using a method according to the invention;

FIG. 2 is a sectional view of said device taken on the line II—II of FIG. 1;

FIG. 3 is a sectional view of the same device taken on the line III—III of FIG. 1;

Figure 4:
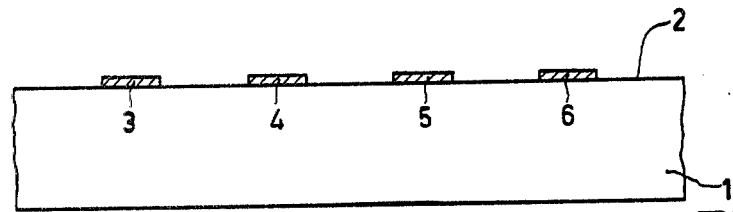
FIGS. 4 to 6 are sectional views, taken on the line II—II of FIG. 1, of the device during various stages of its manufacture.

It is to be noted that the figures are diagrammatic only and are not drawn to scale.

FIGS. 1 to 3 are a plan and sectional view and a few sectional views of a part of a semiconductor device manufactured by using a method according to the invention. The device comprises a semiconductor body 1 in which a number of circuit elements, for example transistors, diodes, resistors capacitances, and the like, may be provided. Said circuit elements which do not form part of the invention are not shown in the figure and may be provided in the body 1 by means of generally known methods of manufacturing integrated circuits. As is usually the case, the semiconductor body 1 is of silicon, although other semiconductor materials might also be used, if desired. The circuit elements are situated near a surface which, as is known, is usually passivated with an insulating layer of, for example, silicon oxide. The passivating layer is not shown either in the figures for reasons of clarity.

In order to connect the circuit elements together and to external supply conductors, the semiconductor body 1 has a conductor pattern at its surface. Said conductor pattern comprises a first set of conductive tracks 3-6 constituting a lowermost conductor level. As is known, said tracks may be connected to the various zones of the underlying circuit elements via contact windows in the said passivating layer.

A second pattern of conductor tracks 7, 8 and 9 is present above said lowermost conductor level and belongs to a higher-situated conductor level, hereinafter termed uppermost conductor level. The conductor tracks 7, 8 and 9 constitute the necessary connections to the conductor tracks 3–6 of the lowermost level. For example, the conductor 7 which interconnects conductors 3 and 6 forms connections 10 and 11, respectively, to the conductors 3 and 6, respectively, of the lowermost level, while the conductor 8 in the part shown is connected only to the conductor 4 at the area of the connection 12. The connections 10–12 are shaded in FIG. 1.

Since with respect to the surface 2 of the body the wiring 7–9 of the uppermost level is situated at a higher level than the conductor tracks 3–6 of the lowermost level, the tracks 7–9 can cross the conductor tracks 3–6 without being electrically shortcircuited therewith. The possibility of such crossings may be considered as the most important advantage of multi-layer wirings because as a result of this the number of possible connections and hence the complexity of the integrated circuit can be increased.

In the plan view of FIG. 1, the tracks 3–6 of the lowermost level are shown in broken lines at the area of the crossings which are referenced 13.

Figure 5:
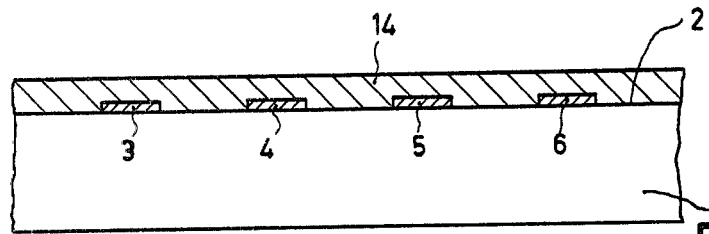
Figure 6:
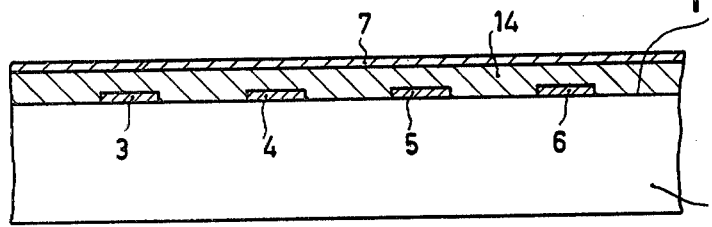
Figure 7:
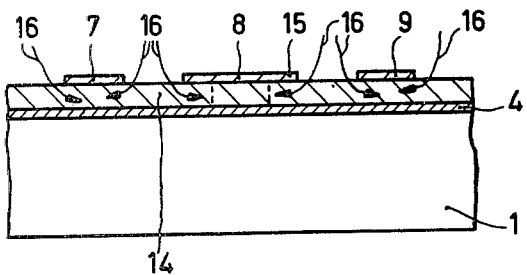
FIG. 7 is a sectional view, taken on the line III—III, of the device shown in FIG. 1 in one of its manufacturing stages.

The manufacture of the device shown in FIGS. 1–3 will be explained with reference to FIGS. 4–7. FIGS. 4–6 are sectional views corresponding to the sectional view shown in FIG. 2 and taken on the line II—II of FIG. 1 in various stages of the manufacture of the device. FIG. 7 is a sectional view corresponding to the sectional view shown in FIG. 3 and taken on the line III—III of FIG. 1 of the device during one of the steps during its manufacture.

FIG. 4 shows the device in the stage in which the conductor tracks 3–6 of the lowermost level are provided on the surface 2. It is assumed that the various zones of the circuit have been formed in the semiconductor body 1 by means of known masked diffusion or implantation of the suitable impurities and that the surface 2 has been provided with a passivating layer or layers in which contact holes are formed. Via said contact holes the tracks 3–6 can be contacted with the various zones in the semiconductor body.

The conductor tracks 3–6 can be obtained by sputtering or evaporating on the surface 2 a layer of the conductor material of the conductor tracks and forming therefrom the conductor tracks by a photolithographic etching treatment.

A suitable metal for the conductor tracks 3–6 is, for example, aluminium. A specific thickness is approximately 0.5 $\mu$m. The conductor tracks 3–6 also be composed from a number of sub-layers of different metals. For example, a suitable combination which can be used advantageously is formed by Pt with Ti and/or Au layers which have successively been provided one on the other. Conductors of this composition are known per se and can be obtained in known manner. The width of the tracks 3–6 is approximately 7 $\mu$m, while the mutual distances between the tracks can be chosen in accordance with the circuit.

In the next process step which is shown in FIG. 5, an intermediate layer 14 is provided which extends over the whole surface 2 and covers the conductor tracks 3–6 and the spaces between said tracks. For said intermediate layer a material is chosen which can be etched selectively with respect to the material or the materials which are used for the conductor patterns of the uppermost and lowermost levels. In addition, the material of the intermediate layer 14 should be electrically conductive and should be capable of good adhesion with the materials of the uppermost and the lowermost conductor levels. A material which has proved to satisfy these requirements well is, for example, nickel (Ni). The thickness of the nickel layer 14 is not critical and is approximately 1 $\mu$m. The Ni can be grown mainly electrolytically after first a thin Ni layer (for example 100 Å) has been vapor-deposited on the surface 2 of the body 1.

The conductor tracks 7–9 are then provided on the intermediate layer 14 (FIG. 6). For these tracks the same materials may be chosen as for the conductor tracks 3–6 of the lowermost conductor level. For example, the tracks 7–9 may consist of Al; the tracks 7–9 may alternatively consist advantageously of double layers such as Pt with Au or TiAu.

As shown in the plan view of FIG. 1 and in the sectional view of FIG. 3 the tracks 7–9 of the uppermost conductor level have widenings at the area of the crossings 10–12.

These widenings play an important part during the subsequent etching treatment to which the intermediate layer 14 is subjected, as is shown in FIG. 7. As an etchant there is used, for example, a solution consisting of 3 vol. of concentrated nitric acid ($HNO_3$) and 7 vol. of water at 50° C. This solution can etch the nickel of the intermediate layer 14 but substantially does not attack the Al or the TiAu layers or PtAu layers of the various conductor levels.

For this etching treatment no separate photomasking step is necessary as would be the case generally in conventional processes in which a layer is to be removed locally. According to the invention, the conductor pattern 7–9 of the uppermost conductor level itself is used as an etching mask, the etching liquid being contacted with the nickel of the intermediate layer 14 via the intermediate spaces between the conductors 7–9 of the uppermost conductor level.

The etching liquid attacks the intermediate layer 14 not only vertically but also laterally below the conductors 7–9. This is denoted by the arrows 16 in FIG. 7. The etching treatment is continued at least for such a period of time that the intermediate layer 14 has disappeared entirely below the conductors 7–9 of the uppermost conductor level except at the area of the widenings 15. With a width of the conductors 7–9 of approximately 5 $\mu$m and a given etching rate, the etching treatment is continued, for example, until the distance over which the intermediate layer 14 is removed is approximately 3 $\mu$m. Since the intermediate layer is attacked on either side of the conductors 7–9, the intermediate layer 14 below the conductors 7–9 will be removed entirely with the given width of the said conductors. At the area of the crossings 13 the conductor levels are then electrically insulated from each other.

The intermediate layer 14 is underetched also at the area of the widenings 15. At this area, however, the intermediate layer 14 is removed only partly up to the boundaries shown in broken lines in FIG. 7. As a result of this, below the widenings 15—which are situated in places where conductor tracks of the uppermost level should be connected electrically to conductor tracks of the lowermost level—separated parts of the intermediate layer 14 are obtained which form the connections 10–12 between the various conductor levels. When the width of the conductor tracks 10–12 at the area of the widenings is approximately twice the width of said tracks at the area of the crossings, so approximately 12

μm, connections 10-12 will be formed having a width of approximately 6 μm.

It is to be noted that the connection parts 10-12 are formed in a self-registering manner with respect to conductor tracks 7-9. A separate photomasking step is not necessary. In addition, the provision of the connections 10-12 hardly constitutes a restricting factor for the paking density. As a matter of fact the conductor tracks 7-9 can be positioned very close together since in the process described no critical alignment steps occur with respect to patterns previously provided in the intermediate layer 14 in which some tolerance should always be observed.

By removing the nickel, the structure shown in FIGS. 2 and 3 is obtained. The conductor tracks 7-9 form bridges which are separated effectively from the conductor tracks of the lowermost level at the area of the crossings 13. Shortcircuits between the conductor levels as they often occur in the usual multi-layer wiring systems in which the conductor levels are separated by an insulating oxide layer on which the uppermost level is deposited, are substantially eliminated in this case. The bridges are supported by piers which are formed by the electrically conducting connections 10-12 which adhere well with the conductor patterns of the various conductor levels.

Figure 8:
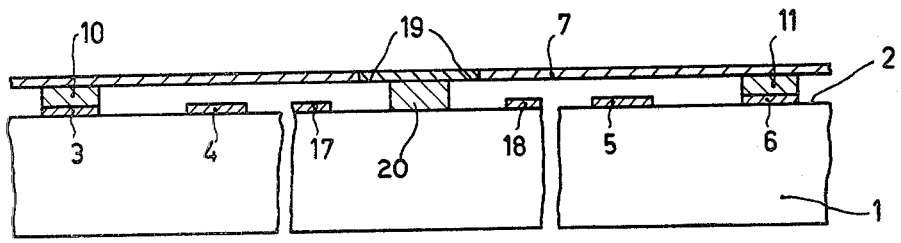
FIG. 8 is a sectional view of a second embodiment of a semiconductor device manufactured by using a method according to the invention.

In the case in which the number of crossings 13 between two such piers is very large, the length of the bridge between said piers (connectors) may also become very large. FIG. 8 shows a possible solution to prevent sagging of the bridge between two successive connections. The sectional view shown in this figure differs mainly therein from the device shown in FIG. 2 by the larger number of conductor tracks of the lowermost conductor level which are situated between the connections 10, 11 and which cross the conductor 7 of the uppermost conductor level. For illustration, the figure shows, in addition to the conductors 3 and 4, also the further conductors 17, 18 which belong to the lowermost conductor level and cross the conductor 7.

In order to prevent the conductor 7 from sagging between the connections, the conductor 7 has an extra widening in the center of the drawing between the tracks 17 and 18, which widening is shown diagrammatically by the lines 19.

During etching of the intermediate layer 14 a pier 20 is also formed below the widening 19 besides at the area of the connections between the various conductor levels. The base of the pier 20 bears directly on the surface of the support member 1 as contrasted with the connection parts 10, 11 which bear on a conductor track of the lowermost level.

The invention is not restricted to the examples described. It will be obvious that many variations are possible to those skilled in the art without departing from the scope of this invention. For example, the conductors of the uppermost level, instead of being constructed with widenings at the area of the connections, may alternatively be provided with narrowings at the area of the crossings so that at the area of the crossings the intermediate layer can be removed entirely by underetching while in other sites parts of the intermediate layer remain. In places where the intermediate layer is to be removed entirely, for example at the area of the crossings, the conductor tracks of the uppermost level may also be provided with apertures so that the intermediate layer can be removed entirely both from the sides of the conductor tracks and through said apertures and only partly at the area of the connections, while nevertheless the conductor tracks of the uppermost level may have the same width everywhere.

Besides by means of providing extra piers, sagging of conductor tracks of the uppermost level can also be prevented by providing below said tracks a suitable lacquer of synthetic resin after etching away the intermediate layer.

Prior to providing the intermediate layer, an insulating layer of, for example, silicon oxide, may also be formed above the conductor tracks of the lower-most level at the area of the crossings, which layer does not cover the tracks of the lowermost level at the area of the connections. The provision of this insulating layer need not be critical. The intermediate layer may then be provided over the whole surface of the body and the process may be further continued as described with reference to the embodiments. In this manner a structure can be obtained in which the conductor tracks of the lowermost level are separated from the uppermost level at the area of the crossings by the insulating layer and by an empty intermediate space. Sagging of tracks of the uppermost level will then cause no shortcircuits.

What is claimed is:

1. A method of manufacturing a semiconductor device comprising a semiconductor body having a first pattern of conductive regions on a major surface thereof and a second pattern of conductive tracks crossing over but spaced apart from said first regions and electrically connected thereto only at selected locations, which comprises:

providing a semiconductor body having a major surface;

providing a first pattern of conductive regions on said major surface;

providing an intermediate conductive layer over the major surface of the body and first pattern, which intermediate layer is capable of being selectively etched with respect to the material of the second pattern of tracks and which can adhere well to the material of the first pattern of regions and the second pattern of tracks;

providing the second pattern of conductive tracks on the intermediate layer;

selectively etching the intermediate layer using the second pattern of tracks as an etching mask to completely remove the intermediate layer by underetching at least below a first portion of the second pattern of tracks crossing over a portion of the first pattern of conductive regions where no electrical interconnection between the first and second conductive patterns is desired, to only partially remove the intermediate layer by underetching below a second portion of the second pattern of tracks crossing over a portion of the first pattern of conductive regions where an electrical interconnection between the first and second conductive patterns is desired, and to only partially remove the intermediate layer by underetching below a third portion of the second pattern of tracks not crossing over a portion of the first pattern of conductive regions so that the remaining part of the intermediate layer on said major surface and beneath said third portion of the second pattern of tracks forms a pier to support said third portion, at least two separate parts of the first pattern of conductive regions being conductively connected at selected locations by at least a part of the second pattern of tracks, said part of the second pattern being supported at said third portion intermediate said two separate parts of the first pattern by said pier.

2. A method as claimed in claim 1, wherein the conductive tracks of the second pattern are wider at the second and third portions thereof than at the first portion thereof.

3. A method as claimed in claim 2, wherein the width of the conductive tracks of the second pattern at the second and third portions thereof is at least twice the width of said tracks at the first portion thereof.

4. A method as claimed in claim 1, wherein the intermediate conductive layer comprises nickel.

5. A method as claimed in claim 4, wherein at least one of the conductive patterns comprises aluminum.

6. A method as claimed in claim 5, wherein at least one of the conductive patterns comprises a double layer having a first layer portion comprising gold and a second layer portion comprising a metal selected from the group consisting of platinum and titanium.

7. A method as claimed in claim 1, wherein the conductive tracks of the second pattern are provided with apertures at first region crossover points where the second pattern and first region are not to be connected.

* * * * *